(12) United States Patent
Morimura et al.

(10) Patent No.: US 6,765,286 B1
(45) Date of Patent: Jul. 20, 2004

(54) SEMICONDUCTOR INTEGRATED CIRCUIT DEVICE

(75) Inventors: Jinichi Morimura, Kanagawa (JP); Hiroya Matsuda, Nagano (JP)

(73) Assignee: Sony Corporation, Tokyo (JP)

( * ) Notice: Subject to any disclaimer, the term of this patent is extended or adjusted under 35 U.S.C. 154(b) by 248 days.

(21) Appl. No.: 09/413,594

(22) Filed: Jul. 2, 2001

(30) Foreign Application Priority Data

Oct. 19, 1998 (JP) .......................................... P10-297162
Feb. 3, 1999 (JP) .......................................... P11-026519

(51) Int. Cl.⁷ .......................... B42D 15/10; H01L 23/28
(52) U.S. Cl. ...................... 257/684; 257/704; 257/712; 257/679; 257/707; 257/710; 257/787
(58) Field of Search ............................... 257/679, 684, 257/704, 707, 710, 712, 700, 701, 758, 787, 786, 784

(56) References Cited

U.S. PATENT DOCUMENTS

| | | | |
|---|---|---|---|
| 4,961,105 A | * 10/1990 | Yamamoto | ................... 257/679 |
| 4,962,415 A | 10/1990 | Yamamoto et al. | |
| 5,122,860 A | 6/1992 | Kikuchi et al. | |
| 5,157,475 A | 10/1992 | Yamaguchi | |
| 5,682,296 A | 10/1997 | Horejs, Jr. et al. | |
| 6,085,412 A | * 7/2000 | Iwasaki | ........................ 29/827 |
| 6,140,697 A | * 10/2000 | Usami et al. | ................. 257/679 |
| 6,166,914 A | * 12/2000 | Sugiyama et al. | .......... 361/737 |

FOREIGN PATENT DOCUMENTS

| | | | | |
|---|---|---|---|---|
| EP | 2 204 182 A | 11/1988 | | |
| EP | 0 412 943 A1 | 2/1991 | | |
| GB | 2 204 182 A | 11/1988 | ........... | H01L/23/48 |
| JP | 2-30597 | * 1/1990 | | |
| JP | 8-185498 | * 7/1996 | | |
| JP | 10-337983 | * 12/1998 | | |

* cited by examiner

Primary Examiner—Alexander O. Williams
(74) Attorney, Agent, or Firm—Bell, Boyd & Lloyd LLC

(57) ABSTRACT

A semiconductor integrated circuit card is disclosed in which such a semiconductor integrated circuit chip device comprising a substrate having a circuit pattern formed thereon, a semiconductor circuit chip bonded onto the substrate and having an electrode connected to the circuit pattern, a reinforcement metal plate, and a seal resin portion for covering a peripheral face of the semiconductor integrated circuit chip and sticking the reinforcement metal plate onto the semiconductor integrated circuit chip is mounted within a card substrate.

9 Claims, 6 Drawing Sheets

SEMICONDUCTOR INTEGRATED CIRCUIT DEVICE

BACKGROUND OF THE INVENTION

1. Field of the Invention

The present invention relates to a semiconductor integrated circuit card manufacturing method and a semiconductor integrated circuit card.

2. Description of the Related Art

A semiconductor integrated circuit chip (IC chip) charged in a semiconductor integrated card (IC card) is sealed by the screen printing of resin.

The IC chip charged in such an IC card has a drawback that the strength thereof is low and dispersion of seal shape and seal thickness thereof is large because it is sealed by the screen printing of resin. If the strength of the IC chip is low, there is a fear that the IC chip is damaged or the connection of the electrodes of the IC chip to the circuit pattern of a substrate comes off when the IC card is bent by an external pressure. If the dispersion of the seal shape and the seal thickness of the IC chip is large, it becomes difficult to control the quality and yield of the IC card.

SUMMARY OF THE INVENTION

In view of such a point, an object of the present invention is to propose a semiconductor integrated circuit chip seal method and a semiconductor integrated circuit chip device capable of providing a semiconductor integrated circuit chip device having extremely high strength and less dispersion of seal shape and seal thickness.

Furthermore, the present invention is about to propose such a semiconductor integrated circuit card that there is no fear that a semiconductor integrated circuit chip device is damaged or connection of the electrode thereof to the circuit pattern of a substrate comes off, and control of quality and yield thereof is easy.

A method for manufacturing a semiconductor integrated circuit card according to a first present invention includes the steps of bonding a semiconductor integrated circuit chip onto a substrate having a circuit pattern formed thereon, connecting an electrode of the semiconductor integrated circuit chip to the circuit pattern, and applying a predetermined quantity of seal resin onto a first reinforcement metal plate; placing the substrate having the semiconductor integrated circuit chip bonded thereto on the first reinforcement metal plate via the applied seal resin; applying a predetermined quantity of seal resin onto the semiconductor integrated circuit chip; disposing a second reinforcement metal plate above the applied seal resin, pressurizing the seal resin via the first and second reinforcement metal plates, and letting flow the seal resin along a peripheral face of the semiconductor integrated circuit chip; and hardening the seal resin let flow along the peripheral face of the semiconductor integrated circuit chip.

According to a method for manufacturing a semiconductor integrated circuit card of the second present invention, a semiconductor integrated circuit chip is bonded onto a substrate having a circuit pattern formed thereon, and an electrode of the semiconductor integrated circuit chip is connected to the circuit pattern. In addition, a predetermined quantity of seal resin is applied onto a first reinforcement metal plate. Subsequently, the substrate having the semiconductor integrated circuit chip bonded thereto is placed on the first reinforcement metal plate via the applied seal resin. Subsequently, a predetermined quantity of seal resin is applied onto the semiconductor integrated circuit chip. Subsequently, a second reinforcement metal plate is disposed above the applied seal resin. In addition, the seal resin is pressurized via the first and second reinforcement metal plates, and the seal resin is let flow along a peripheral face of the semiconductor integrated circuit chip, and the seal resin let flow along the peripheral face of the semiconductor integrated circuit chip is hardened.

DESCRIPTION OF THE PREFERRED EMBODIMENTS

Hereafter, a semiconductor integrated circuit chip (IC chip) seal method, a semiconductor integrated circuit chip device (IC chip device), and a semiconductor integrated circuit card (IC card), which are concrete examples of the invention, will be described with reference to the drawings.

First of all, with reference to FIGS. 1A, 1B and FIGS. 2A to 2E, an IC chip seal method and an IC chip device (FIG. 1B), which are concrete examples of the present invention, will be described. As shown in FIG. 2A, a film substrate 101 having a plurality of circuit patterns KP formed thereon is prepared. As shown in FIG. 2B, a small quantity of bonding agent BD1 is applied onto each circuit pattern KP of the film substrate 101 or onto the film substrate 101 in each circuit pattern KP of FIG. 2A. As shown in FIG. 2C, an IC chip 102 is placed on the bonding agent BD1 of each circuit pattern KP of the film substrate 101, and each IC chip 102 is pressurized. In addition, each IC chip 102 and the film substrate 101 are heated, and each IC chip 102 is bonded (stuck) to a predetermined portion of each circuit pattern KP of the film substrate 101. In addition, an electrode of each IC chip 102 is connected to a predetermined portion of the corresponding circuit pattern KP.

Figure 1A:
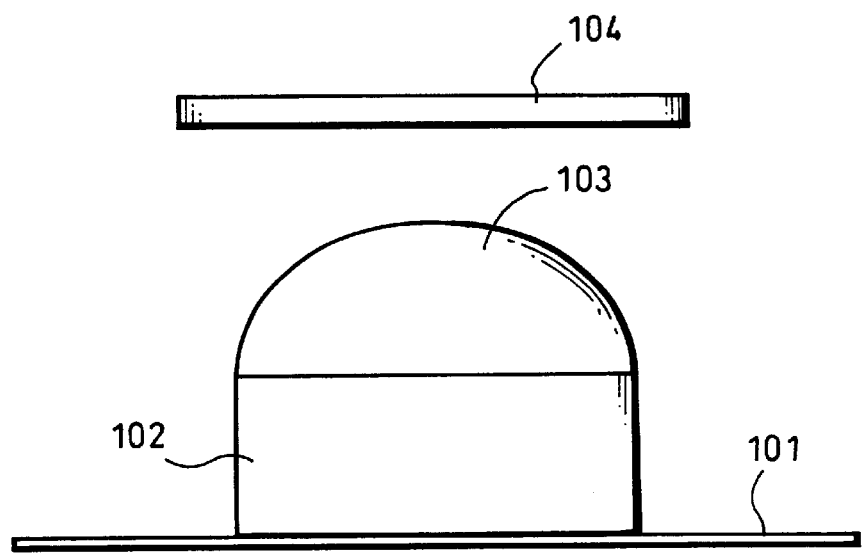
FIGS. 1A and 1B each a process diagram showing an essential part of a semiconductor integrated circuit card according to a first embodiment of the present invention.
Figure 1B:
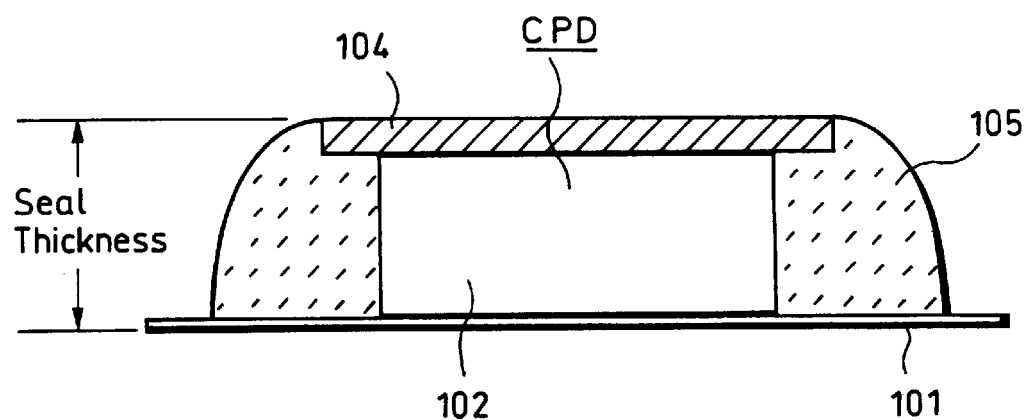
Figure 2A:
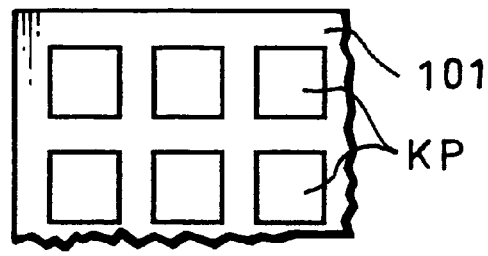
FIGS. 2A to 2E are each a process diagram showing a seal method for an IC chip of the first embodiment.
Figure 2B:
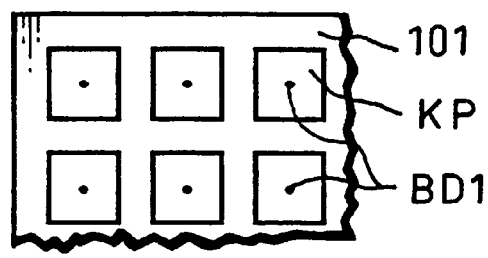
Figure 2C:
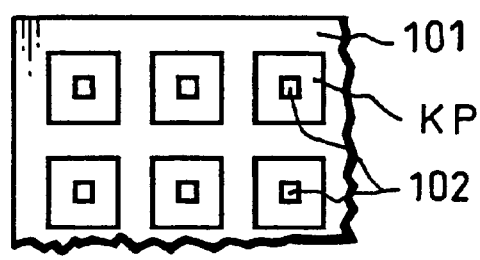
Figure 2D:
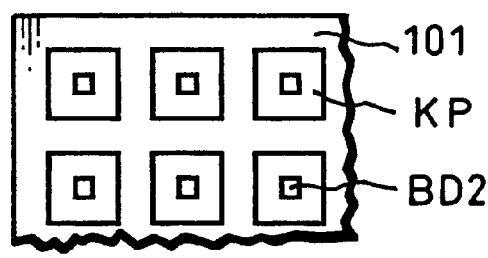
Figure 2E:
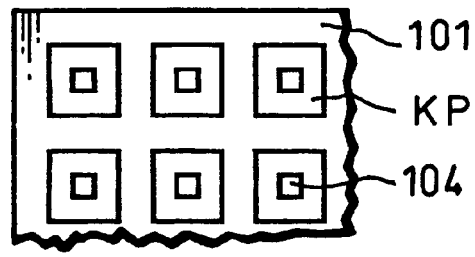

And as shown in FIG. 2D and FIG. 1A, a predetermined quantity of seal resin 103 (bonding agent BD2) is applied onto the IC chip CP, and the seal resin 103 (bonding agent BD2) is irradiated with ultraviolet rays to be subjected to a temporary hardening. As shown in FIG. 2E, FIG. 1A and FIG. 1B, a (rectangular) reinforcement metal plate 104 having a figure similar to the top face (rectangular) of the IC chip 102 and having a wider area than the top face of the IC chip 102 is disposed above the temporarily hardened seal resin 103 (bonding agent BD2). By using a pressurizing jig, the reinforcement metal plate 104 is uniformly pressurized against the top face of the IC chip 102 while holding the parallel state between the reinforcement metal plate 104 and the IC chip 102. As shown in FIG. 1B, the seal thickness is thus made constant. In addition, the seal resin 103 (bonding agent BD2) is let flow along the peripheral face of the IC chip 102 to bond the reinforcement metal plate 104 to the top face of the IC chip 102 and cover the peripheral face of the IC chip 102. Then, a seal resin portion 105 (bonding agent BD2) is irradiated with the ultraviolet rays and thereby hardened. As a result, a plurality of IC chip devices CPD each having a fixed shape and having a fixed seal thickness as shown in FIG. 1B are obtained.

Although not illustrated, the plurality of IC chip devices CPD are punched out at every circuit pattern KP, and are placed on a roll film. In addition, a thin film coating is conducted over each of the IC chip devices CPD and the roll film. Thereafter, the IC chip devices CPD and the roll film are passed between heating rollers. As a result, a card coupling plate having a number of IC cards coupled in a line is obtained. This card coupling plate is cut at a fixed interval. A plurality of fixed length card coupling plates each having a predetermined number of IC cards coupled in a line are obtained. The fixed length card coupling plate is punched out at every IC card. Individual IC cards are thus obtained.

Figure 3:
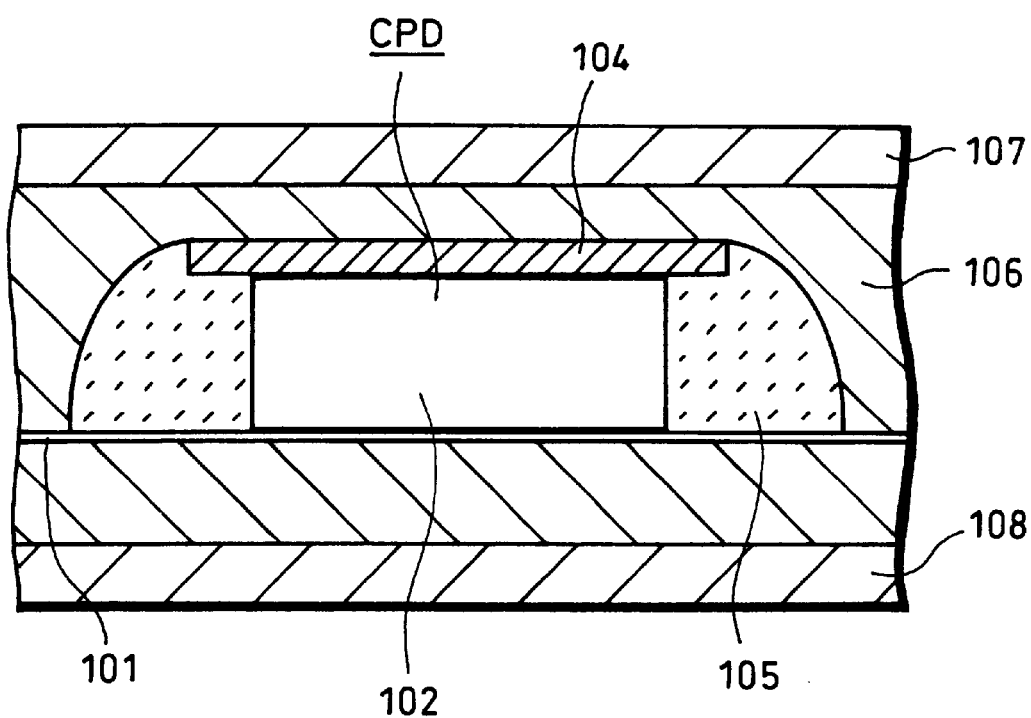
FIG. 3 s a cross-sectional view showing an IC card by the first embodiment.

The structure of the IC card (semiconductor integrated circuit card) having an IC chip enclosed therein will now be described by referring to FIG. 3. The IC chip device CPD is mounted in a card substrate. In other words, the IC chip device CPD is charged into a filled resin layer 106 made of, for example, epoxy resin. Armoring resin plates 107 and 108 made of, for example, polyethylene terephthalate are bonded to the front and rear of the filled resin layer 106, respectively, whereby an IC card is formed.

Therefore, according to the manufacturing method described above, it is possible to obtain such a semiconductor integrated circuit chip device in which the semiconductor integrated circuit chip, the reinforcement metal plate, and the seal resin become an integral structure, the strength is high, and the seal shape and the seal thickness have less dispersion. Therefore, such a semiconductor integrated circuit chip device is extremely suited to be mounted on a semiconductor integrated circuit card.

Therefore, it is possible to obtain such a semiconductor integrated circuit card that there is no fear of a semiconductor integrated circuit chip device being damaged or a connection of an electrode to a circuit pattern of a substrate coming off, and that control of quality and yield is easy.

Next, a semiconductor integrated circuit chip (IC chip) seal method, a semiconductor integrated circuit chip device (IC chip device) and a semiconductor integrated circuit card (IC card), which are concrete examples of the present invention, will be described.

First of all, an IC chip seal method and an IC chip device (FIG. 4B), which are concrete examples of the present invention, will be described with reference to FIGS. 4A, 4B and FIGS. 5A to 5F. As shown in FIG. 5A, a film substrate 401 having a plurality of circuit patterns KP formed thereon is prepared. As shown in FIG. 5B, a small quantity (fixed quantity) of bonding agent BD1 is applied onto each circuit pattern KP of the film substrate 401 of FIG. 5A or onto the film substrate 401 in each circuit pattern KP by using a dispenser. As shown in FIG. 5C, each IC chip 402 is placed on the bonding agent BD1 of each circuit pattern KP of the film substrate 401, and each IC chip 402 is pressurized. In addition, each IC chip 402 and the film substrate 401 are heated, and each IC chip 402 is bonded (stuck) to a predetermined portion of each circuit pattern KP of the film substrate 401. In addition, the electrode of each IC chip 402 is connected to a predetermined portion of a corresponding circuit pattern KP by using a solder.

Figure 4A:
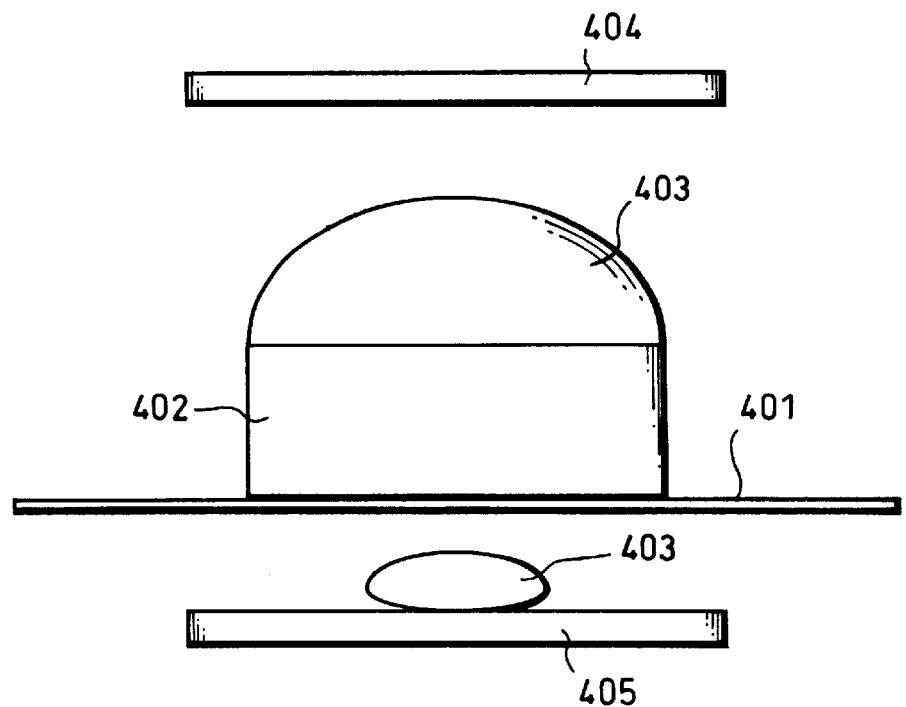
FIGS. 4A and 4B are each a process diagram showing an essential part of a semiconductor integrated circuit card according to a second embodiment of the present invention.
Figure 5A:
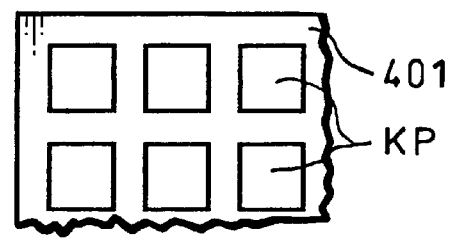
FIGS. 5A to 5F are each a process diagram showing a seal method for an IC chip of the second embodiment.
Figure 5B:
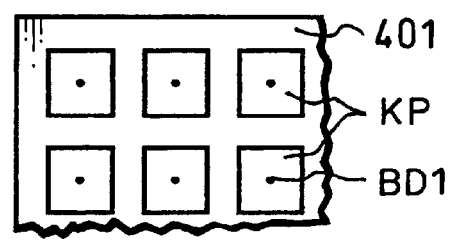
Figure 5C:
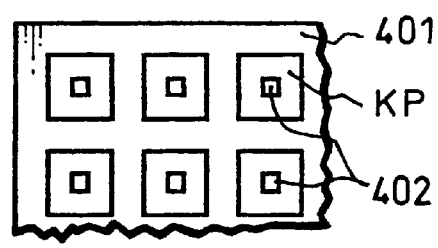
Figure 5D:
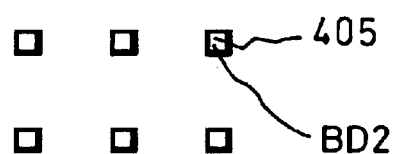

As shown in FIG. 4A and FIG. 5D, a plurality of second reinforcement metal plates 405 (rectangular) each having a figure similar to the bottom face (rectangular) of the IC chip 402 and having a wider area than the bottom face of the IC chip 402 are provided. Onto each of the first reinforcement metal plates MP1, a predetermined quantity (fixed quantity) of seal resin 403 (bonding agent BD2) is applied by using a dispenser. This process may be conducted before, after, or in the middle of the process described above with reference to FIGS. 5A to 5C.

As shown in FIG. 2E, the film substrate FB having the IC chips 402 bonded thereto is placed on the second reinforcement metal plates 405 via the applied seal resin 403 (bonding agent BD2).

Figure 4B:
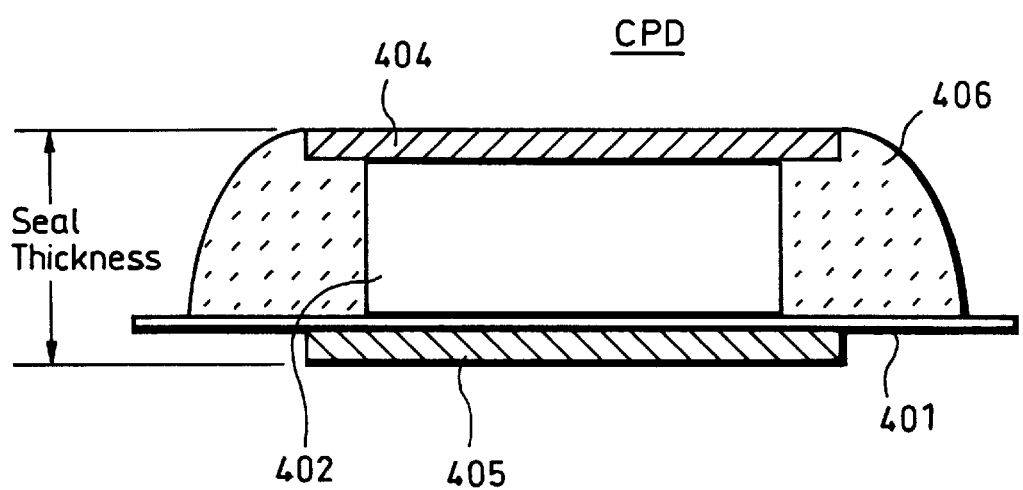
Figure 5E:
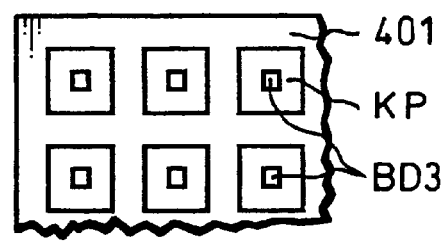
Figure 5F:
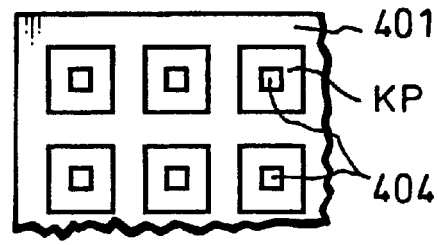

Then, as shown in FIG. 5E and FIG. 4A, a predetermined quantity (fixed quantity) of seal resin 403 (bonding agent BD3) is applied onto each IC chip 402 by using a dispenser, and the seal resin 403 (bonding agent BD3) is irradiated with ultraviolet rays and thus subjected to a temporary hardening. As shown in FIG. 5E, FIG. 4A, and FIG. 4B, a plurality of first reinforcement metal plates 404 (rectangular) each having a figure similar to the top face (rectangular) of each IC chip 402 and having a wider area than the top face of each IC chip 402 are attached to a jig, moved horizontally, and are disposed above the temporarily hardened seal resin 403 (bonding agent BD3). By using a pressurizing jig, a portion between the first and second reinforcement metal plates 404 and 405 is uniformly pressurized, while holding the parallel state among the first and second reinforcement metal plates 404 and 405 and each IC chip 402. As shown in FIG. 4B, the seal thickness is thus made constant, and also the seal resin 403 (bonding agent BD3) is let flow along the peripheral face of each IC chip 402 to bond each second reinforcement metal plate 405 to the film substrate 401 and bond each first reinforcement metal plate 404 onto each IC chip 402 to thereby cover the peripheral face of each IC chip 402. The seal resin 403 (bonding agent BD3) is irradiated with the ultraviolet rays and thereby hardened to form a seal resin portion 406. As a result, a plurality of IC chip devices CPD each having a fixed shape and having a fixed seal thickness as shown in FIG. 4B are obtained.

Although not illustrated, the plurality of IC chip devices CPD are punched out at every circuit pattern KP, and are placed on a roll film. In addition, thin film coating is conducted over each of the IC chip device CPDs and the roll film. Thereafter, the IC chip device CPDs and the roll film are passed between heating rollers. As a result, a card coupling plate having a number of IC cards coupled in a line is obtained. This card coupling plate is cut at a fixed interval. A plurality of fixed length card coupling plates each having a predetermined number of IC cards coupled in a line are obtained. The fixed length card coupling plate is punched out at every IC card. Individual IC cards are thus obtained.

Figure 6:
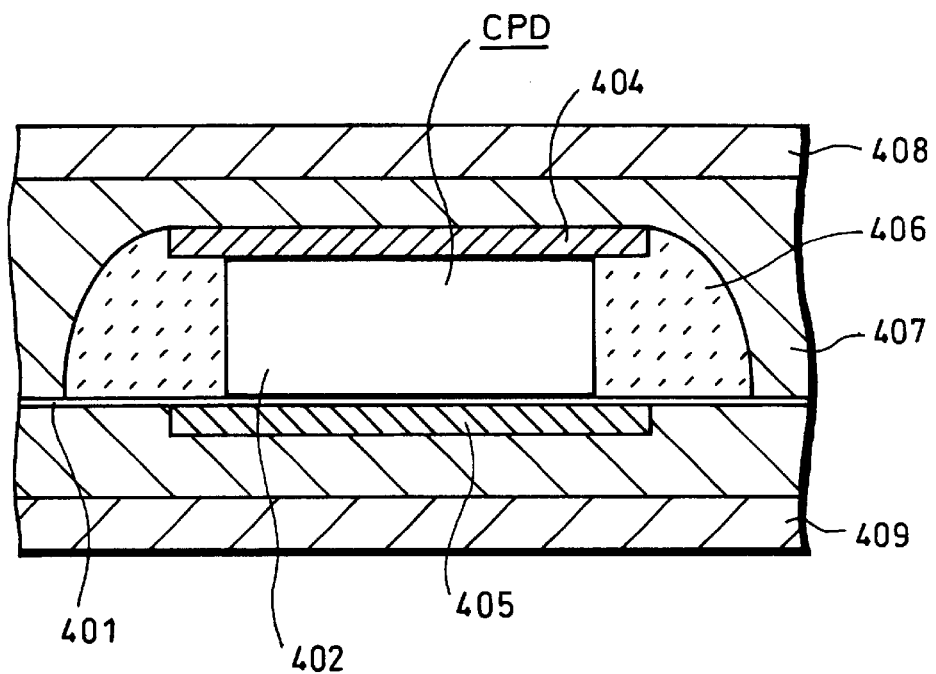
FIG. 6 is a cross-sectional view showing an IC card by the second embodiment.

The structure of the IC card (semiconductor integrated circuit card) having an IC chip 402 enclosed therein will now be described with reference to FIG. 6. The IC chip device CPD is charged in a card substrate. In other words, the IC chip device CPD is charged in a filled resin layer 407 made of, for example, epoxy resin. Armoring resin plates 408 and 409 made of, for example, polyethylene terephthalate are bonded to the front and the rear of the filled resin layer 407, respectively. An IC card is thus formed.

The IC card by the above-mentioned manufacturing method includes a substrate having a circuit pattern formed thereon; a semiconductor integrated circuit chip bonded onto the substrate and having an electrode connected to the circuit pattern; first and second reinforcement metal plates; and a seal resin portion for covering a peripheral face of the semiconductor integrated circuit chip, sticking the first reinforcement metal plate onto the substrate, and sticking the second reinforcement metal plate onto the semiconductor integrated circuit chip. Therefore, it is possible to obtain such a semiconductor integrated circuit chip device in which the semiconductor integrated circuit chip, the first and second reinforcement metal plates gripping the semiconductor integrated circuit chip interposed between, and the seal resin become an integral structure, so that the strength thereof is extremely high, i.e., durability against an external force, such as bending, load, and shock, applied from both the front and the rear thereof is extremely high, and the seal shape and the seal thickness have less dispersion. Therefore, such a semiconductor integrated circuit chip device is extremely suited to be mounted on a semiconductor integrated circuit card.

According to the third present invention, a semiconductor integrated circuit chip device including a substrate having a circuit pattern formed thereon; a semiconductor integrated circuit chip bonded onto the substrate and having an electrode connected to the circuit pattern; first and second reinforcement metal plates; and a seal resin portion for covering a peripheral face of the semiconductor integrated circuit chip, sticking the first reinforcement metal plate onto the substrate and sticking the second reinforcement metal plate onto the semiconductor integrated circuit chip, is charged in a card substrate. Therefore, it is possible to obtain such a semiconductor integrated circuit chip device in which Therefore, it is possible to obtain such a semiconductor integrated circuit card that there is no fear of a semiconductor integrated circuit chip device being damaged or the connection of an electrode to a circuit pattern of a substrate coming off, and that control of quality and yield is easy.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor integrated circuit device comprising:
   a substrate having a circuit pattern thereon;
   a semiconductor integrated circuit chip bonded onto a first surface of the substrate and having an electrode connected to the circuit pattern;
   a first reinforcement metal plate disposed on the semiconductor integrated circuit chip;
   a second reinforcement metal plate disposed on a second surface located on a side of the substrate that is opposite of the first surface;
   a first seal resin disposed on one or more peripheral faces of the semiconductor integrated circuit chip for bonding the first reinforcement metal plate; and
   a second seal resin for bonding the second reinforcement metal plate to the substrate.

2. The semiconductor integrated circuit device of claim 1, wherein the substrate includes a film substrate.

3. The semiconductor integrated circuit device of claim 1, wherein each of the first and second reinforcement metal plates has a plate top surface which is larger in area than a chip top surface of the semiconductor integrated circuit chip.

4. The semiconductor integrated circuit device of claim 1, wherein each of the first and second reinforcement metal plates has a plate top surface which is similar in shape and larger in area than a chip top surface of the semiconductor integrated circuit chip.

5. The semiconductor integrated circuit device as claimed in claim 1, wherein the first and second seal resins are arranged by pressuring the first and second reinforcement metal plates such that the first seal resin flows along the peripheral face of the semiconductor integrated circuit chip and the second seal resin bonds to the substrate.

6. A semiconductor integrated circuit card comprising:
   a substrate having a circuit pattern thereon;
   a semiconductor integrated circuit chip disposed onto a first surface of the substrate and having an electrode connected to the circuit pattern;
   a first reinforcement metal plate disposed on the semiconductor integrated circuit chip;
   a second reinforcement metal plate disposed on a second surface located on a side of the substrate that is opposite of the first surface;
   a first seal resin disposed on one or more peripheral faces of the semiconductor integrated circuit chip for bonding the first reinforcement metal plate;
   a second seal resin for bonding the second reinforcement metal plate to the substrate; and
   a pair of exterior substrates having the semiconductor circuit chip therebetween through a packing resin layer.

7. The semiconductor integrated circuit card of claim 6, wherein the substrate includes a film substrate.

8. The semiconductor integrated circuit card of claim 6, wherein each of the first and second reinforcement metal plates has a plate top surface which is larger in area than a chip top surface of the semiconductor integrated circuit chip.

9. The semiconductor integrated circuit card of claim 6, wherein the first and second seal resins are arranged by pressuring the first and second reinforcement metal plates such that the first seal resin flows along the peripheral face of the semiconductor integrated circuit chip and the second seal resin bonds to the substrate.

* * * * *